United States Patent
Ohizumi et al.

[19]
[11] Patent Number: 6,144,108
[45] Date of Patent: Nov. 7, 2000

[54] SEMICONDUCTOR DEVICE AND METHOD OF FABRICATING THE SAME

[75] Inventors: Shinichi Ohizumi; Yuji Hotta; Seiji Kondo, all of Osaka, Japan

[73] Assignee: Nitto Denko Corporation, Osaka, Japan

[21] Appl. No.: 09/125,523

[22] PCT Filed: Feb. 20, 1997

[86] PCT No.: PCT/JP97/00473

§ 371 Date: Aug. 20, 1998

§ 102(e) Date: Aug. 20, 1998

[87] PCT Pub. No.: WO97/31394

PCT Pub. Date: Aug. 28, 1997

[30] Foreign Application Priority Data

Feb. 22, 1996 [JP] Japan ................................ 8-035154

[51] Int. Cl.$^7$ ............... H01L 23/29; H01L 23/28; H01L 23/48
[52] U.S. Cl. ................. 257/793; 257/666; 257/783; 257/787; 257/729; 438/123; 438/112; 438/124; 438/127; 438/118
[58] Field of Search ................. 257/666, 783, 257/787, 729, 669, 747, 711, 706, 712, 720, 793; 438/123, 112, 124, 127, 118

[56] References Cited

U.S. PATENT DOCUMENTS

| 5,550,711 | 8/1996 | Burns et al. | 361/728 |
| 5,559,306 | 9/1996 | Mahulikar | 174/52.4 |
| 5,581,121 | 12/1996 | Burns et al. | 257/684 |
| 5,821,628 | 10/1998 | Hotta | 257/783 |

FOREIGN PATENT DOCUMENTS

| 54-26879 | 2/1979 | Japan | B32B 27/28 |
| 59-28350 | 2/1984 | Japan | H01L 21/56 |
| 60-180150 | 10/1985 | Japan | 257/788 |
| 63-187652 | 3/1988 | Japan . | |
| 2-58243 | 2/1990 | Japan | H01L 21/56 |
| 3-101542 | 10/1991 | Japan | H01L 23/28 |
| 4-211153 | 8/1992 | Japan | H01L 23/50 |
| 6-279736 | 10/1994 | Japan | C09J 7/00 |
| 8-139119 | 5/1996 | Japan . | |
| 5-198701 | 8/1996 | Japan | H01L 23/28 |

*Primary Examiner*—David Hardy
*Assistant Examiner*—Jhihan B Clark
*Attorney, Agent, or Firm*—Sughrue, Mion, Zinn, Macpeak & Seas, PLLC

[57] ABSTRACT

The present invention is characterized, in a semiconductor device with a semiconductor element sealed by resin, in that a metallic foil is bonded through adhesive to the bottom of a lead frame with the semiconductor element mounted thereon, and another metallic foil is fixed to the outer surface of the sealing resin on the side of the semiconductor element. Such a configuration provides a semiconductor device free from warp. In addition, the effect of no warp and metallic foils on the upper and lower surfaces of the semiconductor device provides a reliable semiconductor device with excellent heat dissipation, less influence from moisture absorption and high thermal stress resistance.

11 Claims, 2 Drawing Sheets

SEMICONDUCTOR DEVICE AND METHOD OF FABRICATING THE SAME

TECHNICAL FIELD

The present invention relates to a semiconductor device with a semiconductor element sealed by resin, and more particularly to a thin (low-profile) large-scaled semiconductor device with excellent heat dissipation and solder heat-resistance and free from warp and a method of fabricating the same.

BACKGROUND OF THE INVENTION

A semiconductor device such as a transistor, IC and LSI has been conventionally sealed using a ceramic package, etc. and has been dominantly resin-sealed from the point of view of cost and mass production. For such resin-sealing, epoxy resin has been used to achieve good result. On the other hand, whereas an increase in the integration degree and large-scaling of a semiconductor element have advanced with technical development in a semiconductor filed, downsizing and low-profiling of a semiconductor has been eagerly demanded. Thus, the rate of volume occupied by resin for sealing has decreased to reduce the thickness of a resin sealing portion. As a result, the semiconductor device has been likely to warp and to generate a connection trouble when the semiconductor device is mounted on a substrate. Particularly, on an ultra-thin semiconductor device less than 1.5 mm, the warp was remarkable. Further, with low-profiling and large-scaling of the semiconductor device, resin sealing has been demanded to have more improved crack-resistance to thermal stress generated during a thermal cycle test (TCT) which is an accelerating test for evaluating the performance of semiconductor sealing resin. Moreover, the surface mounting has become a main stream technique of mounting the semiconductor device so that the semiconductor device has been also required to have solder heat resistance which means that the semiconductor device is free from crack or swelling even when it is solder-immersed in an moist state. In this case also, the semiconductor device is required to have higher solder heat-resistance than before. In addition, development of the integration degree led to an increasing tendency of heat generated in the semiconductor device so that the heat generated during the operation is stored within the semiconductor device. Thus, the temperature might exceed a junction temperature of the semiconductor element, thus resulting in the malfunction of the semiconductor device.

In order to overcome these inconveniences to improve each characteristic evaluated by TCT, it has been proposed to modify epoxy resin as semiconductor sealing resin by silicon compound or supply it with rubber fine grains thereby reducing the thermal stress. Further, in order to improve crack resistance when immersed in solder, it has also been proposed to improve the contact between a lead frame and sealing resin, and select sealing resin with low moisture absorbency. Their effect, however, is not still sufficient. In the resin sealing type semiconductor device described above, since the sealing resin has a very low thermal conductivity, as disclosed in Japanese Patent Publication No. Hei. 5-198701, it has been proposed to dissipate heat through a metallic foil applied on a die pad securing a semiconductor element. In this case, however, a warp is generated owing to unbalance in the material in a thickness direction. In Japanese Patent Publication No. Sho. 63-187652, it is proposed to bond a metallic foil on either or both of the surfaces of a semiconductor device. This technique, since the adhesive or bonding agent layer for bonding is high in moisture absorbency, attenuates the effect of reducing solder heat resistance. In a low-profile semiconductor device widely used in recent years, a warp may be generated in a semiconductor device.

Under such a circumstance, the present invention intends to provide a semiconductor device which can give high solder heat resistance and thermal stress resistance when immersed in solder and high heat dissipation and free from warp, even when it is low-profiled to 1.5 mm or less.

DISCLOSURE OF THE INVENTION

The present invention relates to a semiconductor device and a method for fabricating it as described below.

(1) A resin sealing semiconductor device with a semiconductor element sealed by resin, characterized in that a metallic foil is bonded through adhesive to the bottom of a lead frame with the semiconductor element mounted thereon, and another metallic foil is fixed to the outer surface of the sealing resin on the side of the semiconductor element.

(2) The semiconductor device according to the above (1), characterized in that the lead frame is made of an iron-nickel alloy, the metallic foil bonded to the bottom of the lead frame has a linear expansion coefficient of $0.4$–$2.7 \times 10^{-5}/°$ C., and the metallic foil fixed to the outer surface of the sealing resin on the side of the semiconductor element has a linear expansion coefficient of $0.4$–$0.8 \times 10^{-5}/°$ C. and a thickness of 2–10 times as large as that of the metallic foil on the bottom of the lead frame.

(3) The semiconductor device according to the above (1), characterized in that the lead frame is made of a copper alloy, the metallic foil bonded to the bottom of the lead frame has a linear expansion coefficient of $0.4$–$1.8 \times 10^{-5}/°$ C., and the metallic foil fixed to the outer surface of the sealing resin on the side of the semiconductor element has a linear expansion coefficient of $1.6$–$2.7 \times 10^{-5}/°$ C. and a thickness of 0.5–3 times as large as that of the metallic foil on the bottom of the lead frame.

(4) The semiconductor device according to any one of the above (1)–(3), characterized in that the metallic foil fixed to the outer surface of the sealing resin on the side of the semiconductor element sinks from an outermost product-identifying organic layer thickness thereof.

(5) The semiconductor device according to any one of (1)–(4), characterized in that the adhesive bonding the lead frame to the metallic foil on the bottom of the lead frame contains polycarbodiimide as a main composition.

(6) A method for fabricating a semiconductor device comprising the steps of provisionally fixing a metallic foil on an upper cavity surface of a die, mounting another metallic foil equipped with adhesive on a lower cavity surface of the die with the adhesive being upside, setting a lead frame with a semiconductor element mounted thereon, clamping the die to bond the metallic foils to the lead frame, and injecting resin into the die and molding it.

(7) The method for fabricating a semiconductor device the above (6), characterized in that when the metallic layer is provisionally fixed to the upper cavity surface of the die, said metallic layer having an organic layer having product-identifying function is provisionally fixed to the cavity surface through the organic layer.

(8) The method for fabricating a semiconductor device according to the above (6) or (7), characterized in that the adhesive bonding the lead frame to the metallic film on the bottom of the lead frame contains polycarbodiimide as a main composition.

BRIEF DESCRIPTION OF THE DRAWINGS

FIG. 3A is a view showing the state where a metallic foil 3 is set on a lower die 2 with adhesive located upward and metallic foil 3 is set on an upper die by a provisional securing organic layer 6, FIG. 3B is a view showing the state where a lead frame 8 with a semiconductor element mounted thereon is set, FIG. 3C is a view showing the state where the dies are closed and the lead frame and metallic foil 3 are bonded by adhesive 4, and FIG. 3D is a view showing the state where sealing resin 10 has been injected to be molded.

BEST MODES OF CARRYING OUT THE INVENTION

Figure 1:
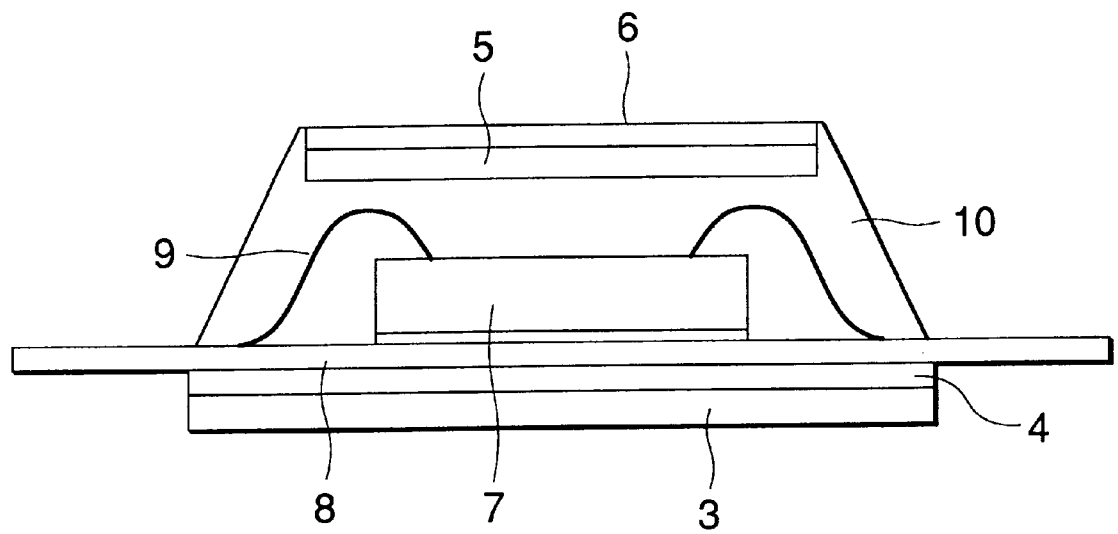
FIG. 1 is a sectional view showing a structure of an element-sealing type resin sealing semiconductor device according to the present invention.

As shown in FIG. 1, in the semiconductor device according to the present a metallic foil 3 is adhered to the bottom of a lead frame 8 on which a semiconductor element 7 is mounted, and another metallic foils having product-identifying function is adhered to the outer surface of a sealing resin on the side of the semiconductor element. The lead frame used in the present invention is made of an iron-nickel alloy having a linear expansion coefficient of $0.4$–$0.8 \times 10^{-5}/°$ C. or a copper alloy having a linear expansion coefficient of $1.6$–$1.8 \times 10^{-5}/°$ C., and generally has a thickness of 0.12–0.25 μm. A case, in which a die pad for securing the semiconductor element 7 is removed and the semiconductor element is directly secured to the metallic foil adhered to the bottom of the lead frame, should be included in the scope of the present invention. The metallic foil adhered to the bottom of the lead frame has a linear expansion coefficient of $0.4$–$2.7 \times 10^{-5}/°$ C. The metallic foil has a thickness of 1–100 μm, preferably 10–50 μm in order to structure a low-profile semiconductor device. The metallic foil which is less than 1μ thick is apt to deform and difficult to deal with. The metallic foil which is larger than 100 μm is not preferred since it hinders low-profiling of the entire semiconductor device. The metallic foil used is made of a copper alloy, iron-nickel alloy or aluminum. Particularly, in order to improve heat dissipation, the metallic foil is preferably made of a copper alloy having a thermal conductivity of about $0.94 \times 10^{-4}$ (cal/cm.sec.° C.)

Figure 2:
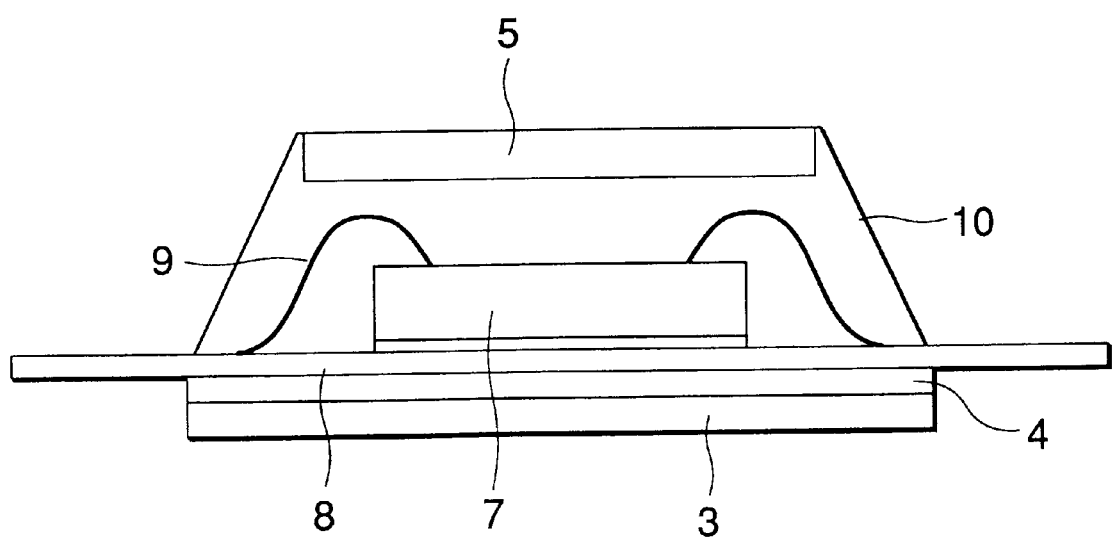
FIG. 2 is a sectional view showing another structure according to the present invention.

On the side of the semiconductor device, a sealing resin 10 is located for sealing the semiconductor element having a thickness of 0.3 mm. Further, on the outer surface, a metallic foil 5 is located for preventing warp of the semiconductor device and advantageously affecting the solder heat resistance and chilled heat cycle. On the surface of the metallic foil, an organic layer 6 is formed. A product-identifying information can be recorded in the organic layer. However, this organic layer is not indispensable. A configuration in which the semiconductor element is provisionally secured to the surface of a die cavity by magnetic force or sucking provides a semiconductor device as shown in FIG. 2. Generally, the semiconductor device as shown in FIG. 2 is likely to warp with the side of the semiconductor element being concave and convex if the lead frame is made of an iron-nickel alloy and is made of a copper alloy, respectively. This is because the members constituting the semiconductor device has different linear expansion coefficients in the process of returning from a molding temperature (generally, 175° C.) to room temperature. As a result of detailed study of the phenomenon, the inventors of the present invention found that by selecting the metallic foils having different linear expansion coefficients in accordance with the material of the lead frame and by changing their rigidity due to a change in thickness, warp of the semiconductor device can be suppressed. Specifically, where the lead frame is made of an iron-nickel alloy, a metallic foil having a linear expansion coefficient of $0.4$–$2.7 \times 10^{-5}/°$ C. can be used on the bottom of the lead frame. In this case, the metallic foil having a linear expansion coefficient of $0.4$–$0.8 \times 10^{-5}/°$ C. and a thickness of 2–10 times as large as that on the bottom of the lead frame is located on the side of the semiconductor element, thereby preventing the semiconductor device from warping.

On the other hand, where the lead frame is made of a copper alloy, a metallic foil having a linear expansion coefficient of $0.4$–$1.8 \times 10^{-5}/°$ C. can be used on the bottom of the lead frame. In this case, the metallic foil having a linear expansion coefficient of $1.6$–$2.7 \times 10^{-5}/°$ C. and a thickness 0.5–3 times as large as that on the bottom of the lead frame is located on the side of the semiconductor element, thereby preventing the semiconductor device from warping. Not having been clarified, this may be because the sealing resin 10 of the thermosetting resin which can be used in the present invention has an average linear expansion coefficient of $1.0$–$2.4 \times 10^{-5}/°$ C. at 20–175° C. and a bending elasticity coefficient of 1000–2000 kg/mm². This may be also because since the sealing resin layer on the lead frame is as thin as 0.4–1.1 mm, the stress generated between the lead frame and sealing resin due to a linear expansion coefficient difference therebetween gives a reverse stress through the metallic foil provided on the side of the semiconductor element.

The resin used for sealing the semiconductor element may be thermosetting resin such as epoxy resin, phenol resin, urea resin, melamine resin, polyester resin, diallylphthalate, polyphenylene sulfide. Among them, from the standpoint of reliability of the resin sealing type semiconductor device, particularly, the epoxy resin may be preferably used. In this case, the epoxy resin is used as a composition mixed with a known additive such as setting promoting agent and filler. The method for sealing the semiconductor element using a composition of epoxy resin should not be particularly limited, but can be carried out by a known molding such as an ordinary transfer molding.

The method for fabricating a semiconductor device according to the present invention is characterized in that in a method of molding resin for sealing the semiconductor element 7 using a cavity die, a metallic foil 5 is provisionally secured to an upper cavity face of the die, a metallic foil 3 supplied with adhesive 4 is mounted on the lower cavity face of the die with the adhesive located above the metallic foil 3, the lead frame 8 is set and thereafter the die is clamped so that the metallic foil is bonded to the lead frame and subsequently, resin is injected and molded.

In the semiconductor device in which the organic layer 6 previously formed on the surface of the metallic foil, as shown in FIG. 1, the organic layer forms an outer surface of the one side of the semiconductor device, and the metallic foil 5 is secured to the lower surface of the organic layer 6 so as to be positioned below the organic layer therefrom. In this case, the metallic foil can be formed on the surface of the die pad after it has been provisionally secured by sucking or using the organic layer given a function of provisional securing.

In the semiconductor device provided with the metallic foil accompanied by no organic layer, as shown in FIG. 2, the metallic foils constitutes the one outer surface of the semiconductor device. In this case, the metallic foils is provisionally secured to the surface of the die pad by sucking before molding.

On the other hand, the metallic foil 3 to be formed on the bottom of the lead frame 8 can be bonded to the lead frame using the adhesive 4. In this case, the metallic foil 3 and lead frame 8 may be previously bonded to each other by the adhesive 4. The semiconductor element can be mounted on such a lead frame equipped with the metallic foil. Otherwise, the metallic foil 3 may be bonded to the lead frame in such a manner that after the metallic film 3 with the adhesive placed upside has been set on the lower side of the die pad and the lead frame with the semiconductor element is mounted thereon, the die pad is clamped. The adhesive 4 used in this case preferably has excellent solubility with sealing resin. In addition, the adhesive preferably has an initial thickness of 10–200 μm and a softening point below 150° C. This is because it important that the adhesive sufficiently flows in between lead pins during clamping by the die heated at 175° C. in order to realize its improved contact with lead pins. In this case, after bonding, the thickness of the adhesive becomes 10–50 μm, and the flowed adhesive 4 goes in between the lead pins. This provides a "dam bar effect" of preventing sealing resin from flowing out from the die during molding.

Further, from the viewpoint of reliability, it is desired that the adhesive 4 has a saturated water absorption coefficient of 0.1 wt % or less at 85° C./85% RH. The adhesive may be epoxy resin, polyimide, polyester resin or polyurethane resin. Particularly, the material containing polycarbodiimide as a main component, which has heat resistance and good water absorption coefficient, is preferred. Polycarbodiimide can be exemplified by the following structural equation (A).

$$-(R=N=C=N)n-  \quad (A)$$

where —R— is preferably

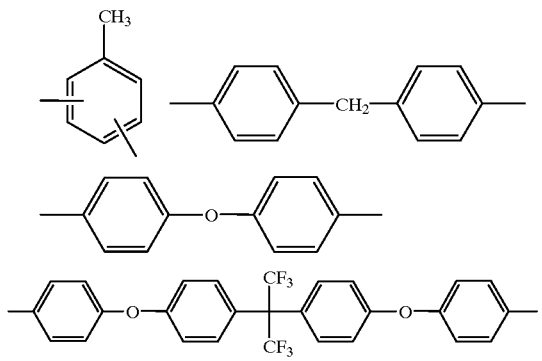

The preferred material contains the carbodimide having the above structural equation as a main component (preferably 70 wt % or more of the adhesive) and epoxy resin, polyetherimide resin or rubber resin as an auxiliary resin. The adhesive may contain filler such as silica.

Figure 3A:
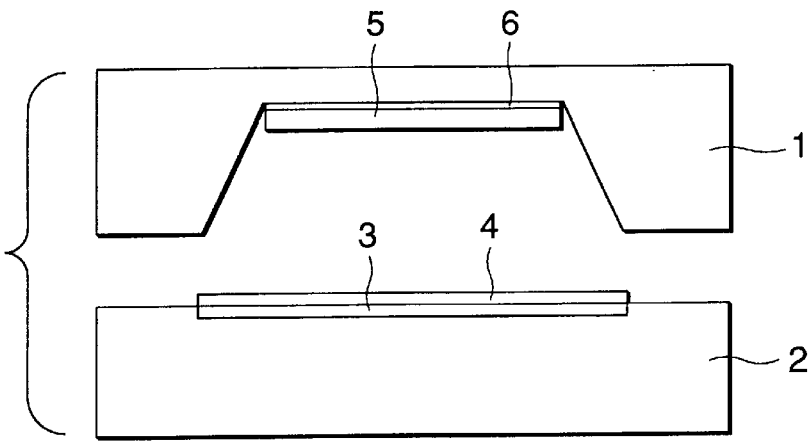
FIGS. 3A to 3D are time-sequential explanation views for fabricating a semiconductor device according to the first embodiment.

A process for fabricating a semiconductor device according to the present invention is shown in time passage in FIGS. 3A to 3D. As shown in FIG. 3A, open upper and lower dies 1 and 2 set at about 175° C. are prepared. A metallic foil 5 is provisionally secured though an organic layer 6 on the upper cavity surface of the upper die 1. A metallic foil 3 having an organic layer 4 is located on the low cavity surface. These metallic foils can be set using vacuum adsorption or magnet, or otherwise using the organic layer located on the metallic foil as a provisional securing agent.

Figure 3B:
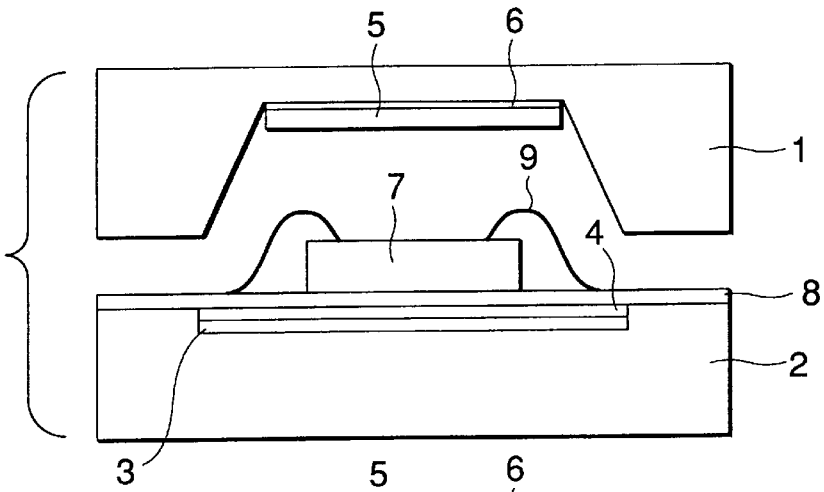
Figure 3C:
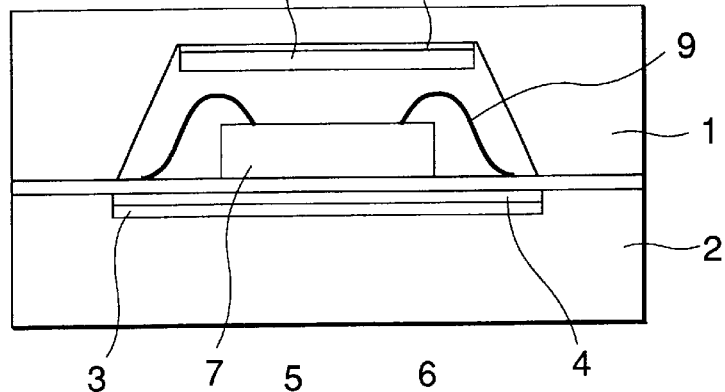
Figure 3D:
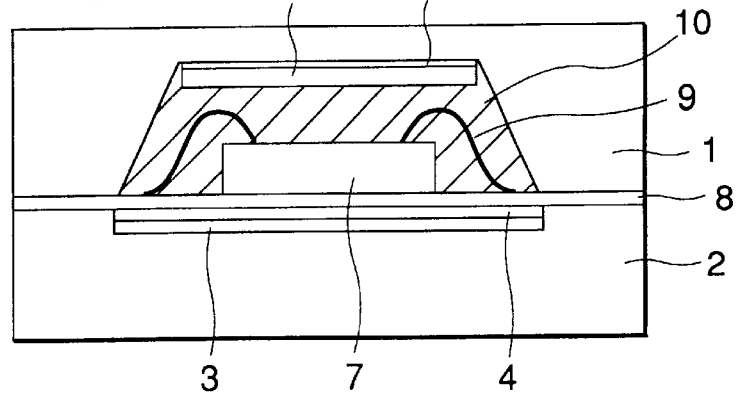

As shown in FIG. 3B, a lead frame 8 equipped with a semiconductor element 7 is supplied. Subsequently, as shown in FIG. 3C, the dies 1 and 2 are closed. Then, the adhesive 4 of the metallic foil flows in between lead pins and between die pad and metallic foil owing to heat from the dies and clamping force for the dies. As shown in FIG. 3D, sealing resin 10 is injected into the dies under the condition set at FIG. 3D. When the dies 1 and 2 are opened, a semiconductor device is taken out which on the one surface, the organic layer 6 is formed and the metallic foil 5 is embedded on the lower side thereof while on the other surface, the metallic foil 3 is exposed.

The organic layer 6 can provide a provisional securing function as adhesive with thermal bonding property. The organic layer 6 may be made of epoxy resin, polyester resin, phenol resin or polyimide resin. The organic layer 6 preferably has a thickness of 5–100 μm. The organic layer 6 serving as a provisional securing function can contain pigment or filler to provide contrast so that it can serve as a product-identifying recording layer.

The semiconductor device is covered with the metallic foil 5 with a rate of preferably 50%, particularly 80% of the one surface area of the semiconductor device. This is because coverage of 50% or more remarkably improves crack resistance during TCT of the completed semiconductor device and during solder immersion.

The semiconductor device according to the present invention has the following features.

1. In contrast to an ordinary semiconductor device, the semiconductor device according to the present invention, in which sealing material is located on only the lead frame, can realize its low-profiling and greatly improve its mounting density.

2. The semiconductor device according to the present invention, in which the prescribed metallic foils are formed on the outer surface of the sealing resin on the side of the semiconductor element and bottom surface of the lead frame, respectively, is difficult to warp although the sealing resin is located on only the lead frame. This makes it easy to mount the semiconductor device on a mother board. During TCT, less deformation due to stress is given to the semiconductor device, thereby lengthening the life.

3. Since the bottom surface of the lead frame is covered, through the adhesive, with the metallic foil having a higher thermal conductivity coefficient than sealing resin, heat in the semiconductor element is apt to dissipate outside the semiconductor device. This enhances the heat dissipation efficiency of the semiconductor device.

4. The semiconductor device according to the present invention, whose major surface area is covered with the metallic foil, is difficult to absorb moisture. In addition, since the strength of the metallic foil is higher than sealing resin, solder heat resistance during solder immersion can be improved.

5. The semiconductor device according to the present invention, whose major surface area is covered with the metallic foil, is difficult to generate a trouble of separating from the die after molding. This gives a high yield of the device.

An explanation will be given of the features of the semiconductor device in contrast to the comparative example.

In the embodiments of the present invention, the sealing resin used is epoxy resin having an average linear expansion coefficient of $2.2\times10^{-5}(1/°$ C.). When the semiconductor element is transfer-molded (condition: hardening after 175° C.×2 minutes and after 175° C.×5 hours), the die pad used has a size of 8×8 mm and the chip has a size of 7×7×0.3 mm. The completed semiconductor device is a 80 pin QFP (size: 20×14 mm).

The test has been carried out by the following measurements.

I TCT (Thermal Cycle Test)

The cycle test was done in a cycle of 50° C. five minutes–150° C. five minutes. The semiconductor device was evaluated in terms of the number of generated cracks when a predetermined number of cycles were measured.

II Solder Heat Resistance

The semiconductor device was left in a constant temperature bath at relative humidity of 85% at 85° C. to absorb moisture. Thereafter, it was immersed in a solder solution at 260° C. for 10 seconds and evaluated in terms of the number of generated cracks.

III Heat Resistance

The semiconductor device whose heat dissipation is to be measured was given a resistor element as the semiconductor device having the same size as described above and capable of generating heat of 2 W. The semiconductor device was molded in a manner described above to provide a sample.

The semiconductor device was subjected to cooling by air at a fluid speed being changed. The heat resistance Rja was obtained on the basis of the following equation.

$$Rja=(Tj-Ta)/Q$$

where Tj: junction temperature, Ta: room temperatures and Q: quantity of generated heat IV Amount of Warp With respect to the semiconductor device after molding, the surface coarseness on each of the side of the semiconductor element and on the opposite side thereto was measured by a contact surface coarseness meter. The difference between the maximum value and minimum value was taken for each measured coarseness. The larger difference was adopted as an amount of warp of the semiconductor device at issue. The values of (+) and (−) means that the semiconductor device warps in a concave shape and convex shape on the side of the semiconductor element, respectively. With the semiconductor device having the size actually used in the test, it was confirmed that the warp within a range of ±30 μm gives no problem in practical use.

1st Embodiment

The organic layer of epoxy resin having a thickness of 20 μm, located on the aluminum alloy foil having a thickness of 30 μm (linear expansion coefficient: $2.6\times10^{-5}/°$ C.), was provisionally secured to be brought into contact with the upper die cavity surface. The epoxy resin whose Tg is 100° C. or less could be easily secured to the upper die. The copper alloy having a thickness of 10 μm (linear expansion coefficient: $1.7\times10^{-5}/°$ C.), on which adhesive having a thickness of 50 μm and containing as a main component fluorine-containing polycarbodimide is applied, is set on the lower die cavity surface. Further, the lead frame of copper alloy (thickness: 125 μm, linear expansion coefficient: $1.7\times10^{-5}/°$ C.) was also set. In this state, the dies were clamped. Thereafter, resin was introduced into the die cavities to mold the semiconductor device.

The aluminum alloy foil having a size of 18×12 mm and the copper alloy having a size of 20×14 mm were located on both sides of the semiconductor device. The total thickness of the semiconductor device was 1 mm. The warp of the semiconductor device thus completed was measured. Thereafter, the semiconductor device was subjected to TCT and solder heat resistance test. The result is shown in Table 1.

The semiconductor device according to this embodiment provides little warp which does not hinder its mounting or packaging, and is excellent in its TCT, solder heat resistance and heat resistance.

The semiconductor device according to this embodiment could be molded with no inconvenience such as voids, deformation of gold lines and deformation of the semiconductor device, thereby providing samples with a high yield. The semiconductor device with no warp could be surely mounted on a mother board.

2nd Embodiment

The semiconductor device was completed in the same manner as in the first embodiment except that an iron-nickel alloy (having a thickness of 50 μm and linear expansion coefficient of $0.4\times10^{-5}/°$ C.) was used as the metallic foil on the semiconductor device, a 42 alloy (having a thickness of 125 μm and linear expansion coefficient of $0.4\times10^{-5}/°$ C.) was used as the lead frame, and a copper metallic foil (having a thickness of 25 μm and linear expansion coefficient of $1.7\times10^{-5}/°$ C.) was used as the metallic foil on the bottom of the lead frame. The test result of the semiconductor device according to the present invention is shown in Table 1. It can be seen that like the first embodiment, the good result was obtained.

COMPARATIVE EXAMPLES 1 AND 2

Using component materials as shown in Table 2, the semiconductor devices were fabricated in the same manner as in the first embodiment. The completed semiconductor devices were subjected to the same test as for the first embodiment. The test results are shown in Table 1. The first comparative example, in which with the lead frame made of copper, the metallic foil on the semiconductor element is made of iron-nickel alloy (42 alloy) having a linear expansion coefficient of $0.4\times10^{-5}/°$ C., generated a warp of a convex shape on the side of the semiconductor element. The warp gave the worse result of TCT as compared with the embodiments according to the present invention.

The second comparative example, in which with the lead frame made of the 42 alloy, the metallic foil on the bottom of the lead frame is made of the 42 alloy and that on the semiconductor element is made of the aluminum having a linear expansion coefficient of $2.6\times10^{-5}/°$ C., generated a warp of a concave shape on the side of the semiconductor element. The warp gave the worse result of TCT as compared with the embodiments according to the present invention.

TABLE 1

|  |  | Embodiment | | Comparative Example | |
| --- | --- | --- | --- | --- | --- |
|  |  | 1 | 2 | 1 | 2 |
| TCT (Number of Products with Cracks Generated/20 Products) | 200 Cycle | 0 | 0 | 0 | 0 |
|  | 500 Cycle | 0 | 0 | 1 | 2 |
|  | 1000 Cycle | 0 | 6 |  |  |
| Solder Heat Resistance (Number of Products with Cracks Generated/20 Products | 96 Hours | 0 | 0 | 0 | 0 |
|  | 168 Hours | 0 | 0 | 0 | 2 |
|  | 500 Hours | 0 | 0 | 2 | 4 |
| Heat Resistance | 1 m/sec | 17 | 17 | 17 | 26 |

TABLE 1-continued

|  |  | Embodiment | | Comparative Example | |
|---|---|---|---|---|---|
|  |  | 1 | 2 | 1 | 2 |
| (W/° C.) | 3 m/sec | 10 | 11 | 9 | 14 |
|  | 5 m/sec | 8 | 8 | 8 | 11 |
| Warp of Semiconductor Device (μm) | Concave shape (+) |  |  |  |  |
|  | Convex shape (−) | 19 | −13 | −56 | 240 |

TABLE 2

|  | Embodiment 1 | Embodiment 2 | Comparative Example 1 | Comparative Example 2 |
|---|---|---|---|---|
| Metallic foil on the Side of Semiconductor element (A) | Aluminum 30 μm | 42 Alloy 50 μm | 42 Alloy 30 μm | Aluminum 40 μm |
| Lead Frame (B) | Copper | 42 Alloy | Copper | 42 Alloy |
| Metallic Foil on the Bottom of Lead Frame | Copper 10 μm | Copper 25 μm | Copper 10 μm | 42 Alloy 10 μm |
| Thickness Rate between Metallic Foils (A/B) | 3 | 2 | 3 | 4 |

*linear expansion coefficient of used metal: aluminum; $2.6 \times 10^{31\ 5}$ /° C. copper; $1.7 \times 10^{-5}$/° C. 42 alloy; $0.4 \times 10^5$/° C.

INDUSTRIAL APPLICABILITY

The present invention is characterized in that a metallic foil is set on the bottom of a lead frame on which a semiconductor element is mount and another metallic foil is set on the outer surface of sealing resin on the semiconductor element. Such a configuration permits the semiconductor device to be easily low-profiled, and provides the semiconductor device with excellent moisture resistance, solder heat resistance during solder immersion, thermal stress resistance and high heat dissipation. The warp of the semiconductor device can also be reduced by a suitable combination of the linear expansion coefficient and thickness of the metallic foil. Therefore, the semiconductor device can be surely mounted on a mother board.

What is claimed is:

1. A resin sealing semiconductor device with a semiconductor element sealed by a sealing resin, wherein a first metallic foil is bonded through adhesive to a bottom of a lead frame with the semiconductor element mounted thereon, and a second metallic foil is fixed to the outer surface of the sealing resin on the side of the semiconductor element, and wherein the lead frame is made of an iron-nickel alloy, the first metallic foil bonded to the bottom of the lead frame through the adhesive has a linear expansion coefficient of $0.4-2.7 \times 10^{-5}$/° C., and the second metallic foil fixed to the outer surface of the sealing resin on the side of the semiconductor element has a linear expansion coefficient of $0.4-0.8 \times 10^{-5}$/° C. and a thickness of 2–10 times as large as that of the first metallic foil on the bottom of the lead frame.

2. A resin sealing semiconductor device with a semiconductor element sealed by a sealing resin, wherein a first metallic film is bonded through adhesive to a bottom of a lead frame with the semiconductor element mounted thereon, and a second metallic foil is fixed to the outer surface of the sealing resin on the side of the semiconductor element, and wherein the lead frame is made of a copper alloy, the first metallic foil bonded to the bottom of the lead frame through the adhesive has a linear expansion coefficient of $0.4-1.8 \times 10^{-5}$/° C., and the second metallic foil fixed to the outer surface of the sealing resin on the side of the semiconductor element has a linear expansion coefficient of $1.6-2.7 \times 10^{-5}$/° C. and a thickness of 0.5–3 times as large as that of the first metallic foil on the bottom of the lead frame.

3. The semiconductor device according to any one of claims 1 and 2, wherein the second metallic foil fixed to the outer surface of the sealing resin on the side of the semiconductor element sinks from an outermost organic layer having product-identifying function by a thickness thereof.

4. The semiconductor device according to any one of claims 1 and 2, wherein the adhesive bonding the lead frame to the metallic foil on the bottom of the lead frame contains polycarbodiimide as a main composition.

5. The semiconductor device according to claim 3, wherein the adhesive bonding the lead frame to the metallic foil on the bottom of the lead frame contains polycarbodiimide as a main composition.

6. A method for fabricating a semiconductor device comprising the steps of:
provisionally fixing a first metallic foil on an upper cavity surface of a die through an organic layer previously formed on said first metallic foil;
mounting a second metallic foil equipped with an adhesive on a lower cavity surface of the die with the adhesive being disposed between the second metallic foil and the die;
setting a lead frame with a semiconductor element mounted thereon;
clamping the die to bond the second metallic foil to the lead frame; and
injecting resin into the die and molding it.

7. The method for fabricating a semiconductor device according to claim 6, wherein said organic layer performs a product-identifying function.

8. The method for fabricating a semiconductor device according to any one of claims 6 and 7, wherein the adhesive bonding the lead frame to the metallic film on the bottom of the lead frame contains polycarbodiimide as a main composition.

9. The method of claim 6, wherein said lead frame is made of an iron-nickel alloy, said first metallic foil has an liner expansion coefficient of $0.4-2.7 \times 10^{-5}$/° C., and said second metallic foil has a linear expansion coefficient of $0.4-0.8 \times 10^{-5}$/° C., and a thickness of 2–10 times as large as that of the first metallic foil.

10. The method of claim 6, wherein said lead frame is made of a copper alloy, said first metallic foil has an liner expansion coefficient of $0.4-1.8 \times 10^{-5}$/° C., and said second metallic foil has a linear expansion coefficient of $1.6-2.7 \times$ $10^{-5}/°$ C., and a thickness of 1.5–3 times as large as that of the first metallic foil.

11. A resin sealing semiconductor device with a semiconductor element sealed by a sealing resin, wherein a first metallic foil is bonded through adhesive to a bottom of a lead frame with the semiconductor element mounted thereon, and a second metallic foil is fixed to the outer surface of the sealing resin on the side of the semiconductor element, and wherein the lead frame is made of a 42 alloy, the first metallic foil bonded to the bottom of the lead frame through the adhesive has a linear expansion coefficient of approximately $0.4 \times 10^{-5}/°$ C., and the second metallic foil fixed to the outer surface of the sealing resin on the side of the semiconductor element has a linear expansion coefficient of $1.7 \times 10^{-5}/°$ C. and a thickness of 2–10 times as large as that of the first metallic foil on the bottom of the lead frame.

* * * * *